(12) United States Patent
Nakagawa et al.

(10) Patent No.: US 8,400,855 B2
(45) Date of Patent: Mar. 19, 2013

(54) SEMICONDUCTOR DEVICE

(75) Inventors: Hiroshi Nakagawa, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 273 days.

(21) Appl. No.: 12/860,058

(22) Filed: Aug. 20, 2010

(65) Prior Publication Data

US 2011/0044120 A1 Feb. 24, 2011

(30) Foreign Application Priority Data

Aug. 24, 2009 (JP) ................................. 2009-193327

(51) Int. Cl.
*G11C 7/00* (2006.01)
(52) U.S. Cl. ...................................................... 365/203
(58) Field of Classification Search .................... 365/203
See application file for complete search history.

(56) References Cited

U.S. PATENT DOCUMENTS

| 6,052,330 | A | 4/2000 | Tanabe |
| 6,108,256 | A * | 8/2000 | Schneider ..................... 365/203 |
| 6,449,204 | B1 * | 9/2002 | Arimoto et al. ............... 365/222 |
| 7,130,232 | B2 * | 10/2006 | Kim et al. ..................... 365/203 |

FOREIGN PATENT DOCUMENTS

JP 11-45568 A 2/1999

* cited by examiner

*Primary Examiner* — Hoai V Ho
*Assistant Examiner* — Pablo Huerta
(74) *Attorney, Agent, or Firm* — Sughrue Mion, PLLC

(57) ABSTRACT

A semiconductor device includes a data transmission line and a data transmission line precharge circuit. The data transmission line precharge circuit sets a precharge potential of the data transmission line to a first potential at the time of a first write mode in which data masking is not performed. The data transmission line precharge circuit sets the precharge potential to a potential different from the first potential at the time of a second write mode in which data masking is performed. When data masking is not carried out, precharging to a potential at which data can be written in excellent fashion can be performed. When data masking is carried out, precharging to a potential that inhibits a fluctuation in bit-line potential can be performed.

23 Claims, 8 Drawing Sheets

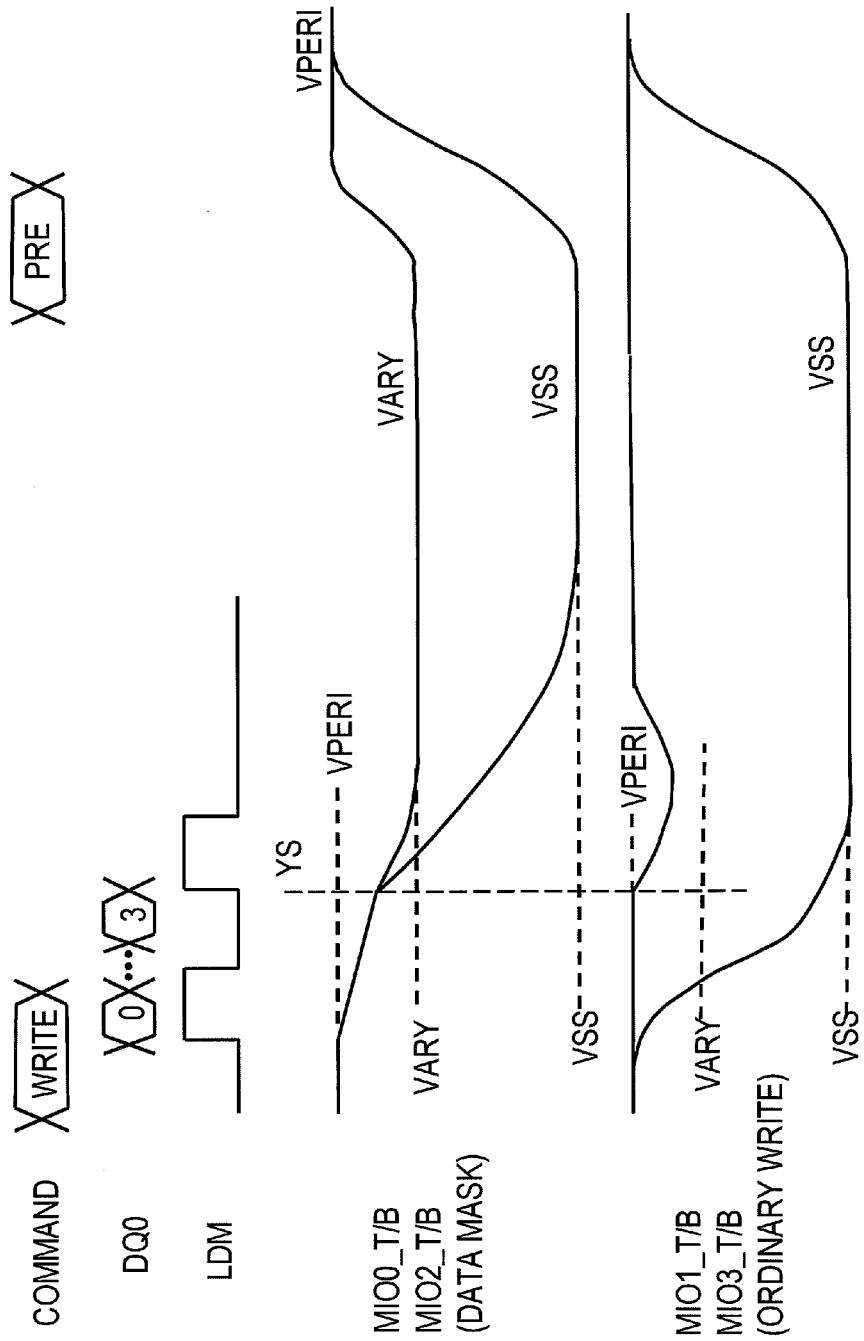

SEMICONDUCTOR DEVICE

REFERENCE TO RELATED APPLICATION

This application is based upon and claims the benefit of the priority of Japanese patent application No. 2009-193327, filed on Aug. 24, 2009, the disclosure of which is incorporated herein in its entirety by reference thereto.

TECHNICAL FIELD

This invention relates to a semiconductor memory and semiconductor device. More particularly, the invention relates to a semiconductor memory and semiconductor device having a write mode in which data masking is performed and a write mode in which data masking is not performed.

BACKGROUND

In the field of semiconductor devices such as semiconductor memories, advances in process microfabrication in recent years have made possible the practical utilization of semiconductor devices of greater scale, and advances are also being made in lowering the voltage of the power supply for such semiconductor devices. Progress in lowering the voltage of the semiconductor device power supply has been accompanied by use of lower voltages for memory cell arrays in DRAMs, for example, and it is important to reduce voltage fluctuations in the power source and signals in the vicinity of sense amplifiers.

A semiconductor device such as a memory known in the art has a function for masking data when data is written. For example, Patent Document 1 describes a semiconductor storage device in which write data is input to a synchronous DRAM at a speed that is an integral number of times greater than the clock frequency, a data masking signal is input in synch with the input data and data masking can be performed for every bit of the write data.

[Patent Document 1]
Japanese Patent Kokai Publication No. JP-H11-45568A, which corresponds to U.S. Pat. No. 6,052,330.

SUMMARY

The entire disclosures of the above-mentioned Patent Documents are incorporated herein by reference thereto.

The analysis below is given by the present invention. Problems relating to data masking will be described taking a DRAM as an example. In the ordinary write mode in which masking of data is not performed, data received externally is sent through a write amplifier and data transmission line and is written to a memory cell via a sense amplifier selected by a column address.

On the other hand, in a write mode in which data is masked, the write amplifier does not operate to send the data to the data transmission line. The data transmission line is connected, while still in the pre-charged state, to the sense amplifier selected by the column address. The potential on the bit line of the sense amplifier fluctuates owing to charge sharing when the selection switch that connects the data transmission line and the sense amplifier is turned on by the column address.

Ordinarily, the data in the sense amplifier will not be destroyed even if fluctuation of the bit-line potential occurs. However, it is conceivable that the sense amplifier will perform signal inversion erroneously if an imbalance in the threshold value becomes too large owing to process variations. In particular, since microfabrication is accompanied by a decline in the supply voltage of the memory cell array, measures for dealing with the write mode in which data masking is performed have become important.

According to a first aspect of the present invention, there is provided a semiconductor memory including a data transmission line and a data transmission line precharge circuit. The data transmission line precharge circuit sets a precharge potential of a data transmission line to a first potential at the time of a first write mode in which data masking is not performed. And the data transmission line precharge circuit sets the precharge potential to a potential different from the first potential at the time of a second write mode in which data masking is performed.

According to a second aspect of the present invention, there is provided a semiconductor memory including a memory cell array including a plurality of bit lines, a plurality of selection switches each connected to a corresponding one of the plurality of bit lines, a plurality of write amplifiers, and a plurality of data transmission line pairs. Each of the transmission line pairs which connects a corresponding one of the write amplifiers and corresponding ones of the plurality of selection switches. Each of the plurality of data transmission line pairs transmits output data of the corresponding write amplifier as a pair of complementary signals, which includes a non-inverted signal and an inverted signal, at write time. The semiconductor memory further includes a data transmission line precharge circuit precharges the plurality of data transmission line pairs to a first potential and subsequently sets, to an intermediate potential, a precharge potential of a data transmission line pair that performs data masking among the plurality of data transmission line pairs at write time. The intermediate potential is a potential that is intermediate the first potential and a second potential at which the write amplifier discharges one data transmission line of a data transmission line pair that does not perform data masking at write time.

According to a third aspect of the present invention, there is provided a semiconductor device including write amplifiers of a plurality of bits, data transmission lines of a plurality of bits connected to respective ones of the write amplifiers of the plurality of bits, and a plurality of flip-flops connected to the data transmission lines of each of the bits via respective ones of selection switches. The semiconductor device further including a data transmission line precharge circuit that exercises control such that before data of the plurality of bits is written from the write amplifiers to flip-flops selected by the selection switches via the data transmission lines, precharge potential of the data transmission lines is made a first potential with regard to bits that do not perform data masking, and precharge potential of data transmission lines that perform data masking is made a potential different from the first potential.

The meritorious effects of the present invention are summarized as follows.

In accordance with the present invention, data write is executed after a data transmission line is precharged to a potential when data masking is performed and to a different potential when data masking is not performed. When data masking is not performed, therefore, precharging is performed to a potential at which data can be written in excellent fashion. When data masking is carried out, precharging can be performed to a potential that suppresses a fluctuation in bit-line potential.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 7 is an operation waveform diagram in the case of a write mode of bits in which data masking is performed and of bits in which data masking is not performed in the semiconductor memory according to an exemplary embodiment.

PREFERRED MODES

The present invention provides a semiconductor memory having a data transmission line precharge circuit for exercising control such that a precharge potential of a data transmission line is made a first potential at the time of a first write mode in which data masking is not performed, and the precharge potential of the data transmission line is made a potential different from the first potential at the time of a second write mode in which data masking is performed. When data masking is not performed, therefore, precharging can be performed to a potential suited to high-speed data write. When data masking is carried out, precharging can be performed to a potential that suppresses a fluctuation in the potential of a bit line connected to the data transmission line.

In accordance with the arrangement described above, the side of a memory cell array that receives data on a data transmission line need not have its circuit configuration or operation changed depending upon whether or not data masking is carried out. Further, in a case where data of a plurality of bits is written in parallel, whether data masking is to be performed can easily be set on a bit-by-bit basis.

Preferred exemplary embodiments of the present invention will now be described in detail with reference to the drawings.

[First Exemplary Embodiment]

Figure 1:
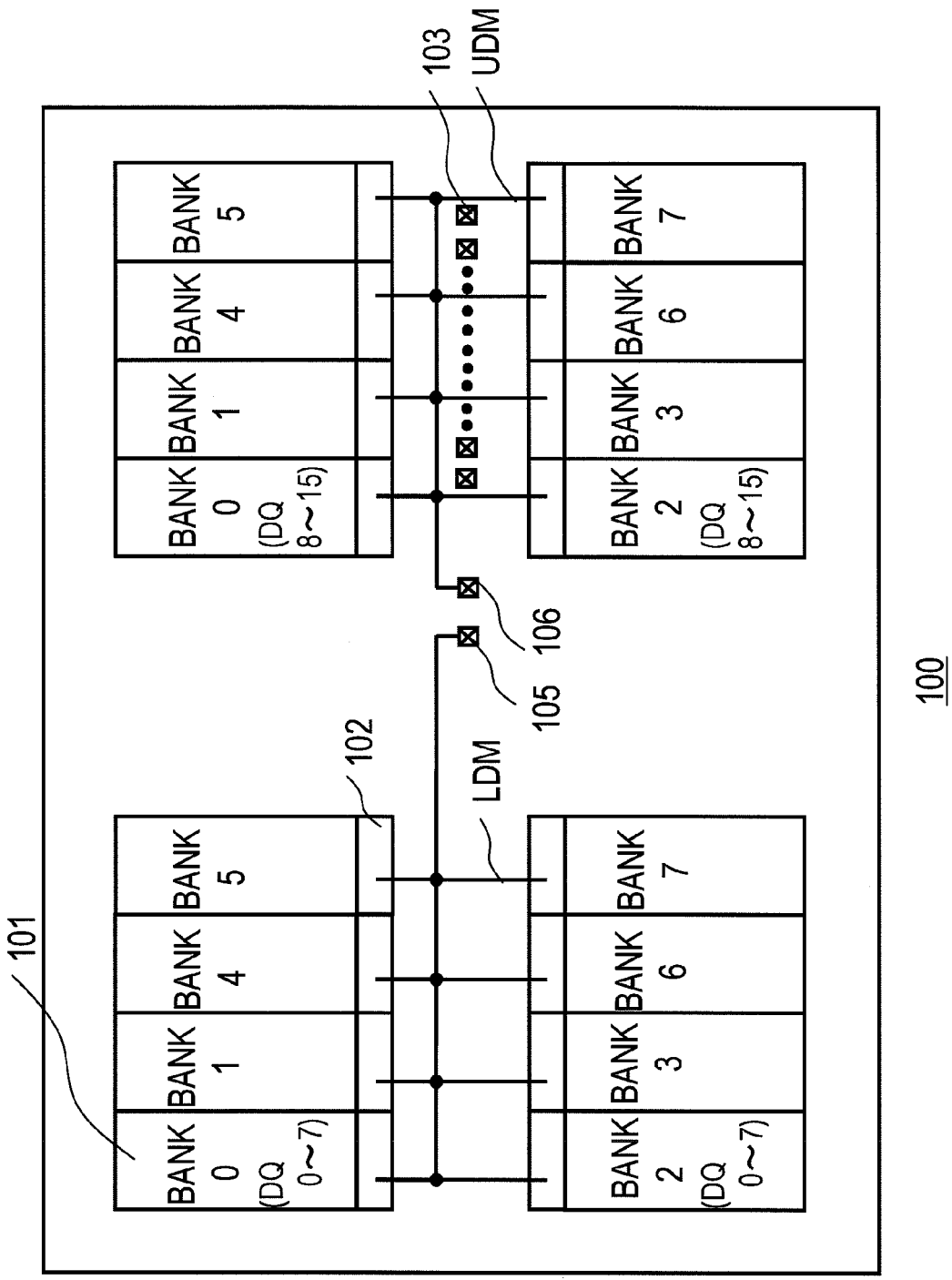
FIG. 1 is a block diagram illustrating the entirety of a semiconductor memory according to an exemplary embodiment of the present invention.

FIG. 1 is a block diagram illustrating the entirety of a semiconductor memory according to this exemplary embodiment of the present invention. As shown in FIG. 1, a semiconductor memory 100 is a DDR3 SDRAM (Double-Data-Rate 3 Synchronous Dynamic Random-Access Memory) includes eight banks. It should be noted that this DDR3 SDRAM is strictly an example of a preferred exemplary embodiment and the scope of application of the present invention is not limited to a DDR3 SDRAM. The invention is applicable to a semiconductor memory other than a DRAM and to a semiconductor device other than a semiconductor memory.

The semiconductor memory 100 is provided with 16 data input/output terminals 103 corresponding to bits DQ0 to DQ15. Each data input/output terminal 103 is connected to a read/write control circuit 102 of each bank via an input/output circuit, not shown. Memory cell array areas 101 of banks 0 to 7 are arranged by being divided into eight lower-order bits (DQ0 to DQ7) and eight higher-order bits (DQ8 to DQ15) (namely into left and right halves as shown in the drawing). The read/write control circuit 102 is provided for every memory cell array area 101 of each bank of the eight lower-order bits and eight higher-order bits. Among the 16 data input/output terminals (DQ0 to DQ15), the data input/output terminals (DQ0 to DQ7) of the eight lower-order bits are connected to the read/write control circuit 102 corresponding to the memory cell array area in which the eight lower-order bits are disposed, and the data input/output terminals (DQ8 to DQ15) of the eight higher-order bits are connected to the read/write control circuit 102 corresponding to the memory cell array area in which the eight higher-order bits are disposed.

An LDM terminal 105 and a UDM terminal 106 are terminals for data-masking write data of the eight lower-order bits (DQ0 to DQ7) and eight higher-order bits (DQ8 to DQ15), respectively. Whether masking is performed or not can be changed over for every bit of data, which is input serially from the corresponding data input/output terminals (DQ0 to DQ7, DQ8 to DQ15), using both edges, namely the rising and falling edges of a data strobe signal (DQS) (not shown), as a reference.

The LDM terminal is connected to the read/write control circuits 102 corresponding to the memory cell array areas 101 (the memory cell array areas 101 on the left side in FIG. 1) in which the bits DQ0 to DQ7 of each bank are disposed. Similarly, the UDM terminal is connected to the read/write control circuits 102 corresponding to the memory cell array areas 101 (the memory cell array areas 101 on the right side in FIG. 1) in which the bits DQ8 to DQ15 of each bank are disposed.

Figure 2:
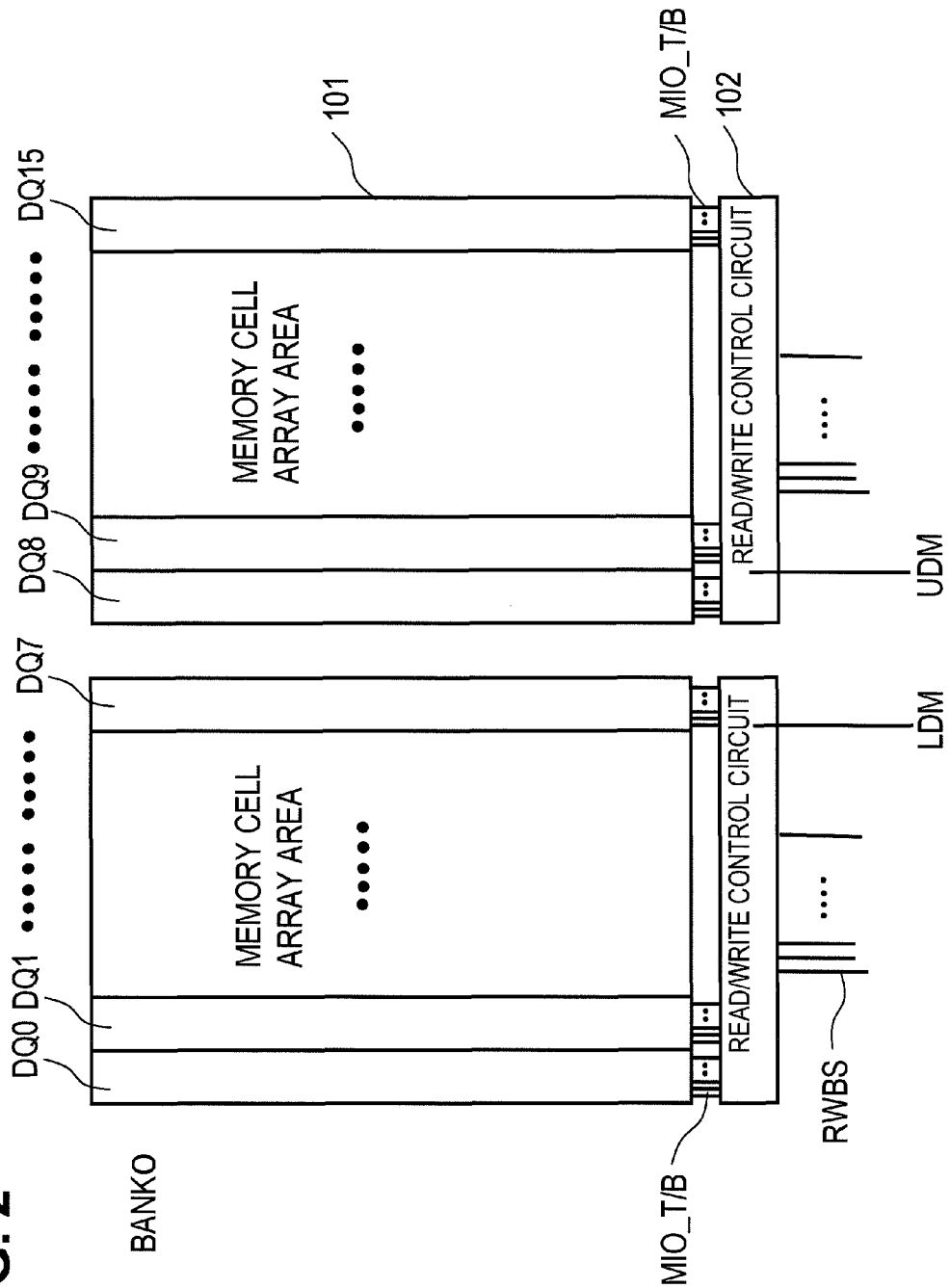
FIG. 2 is a block diagram illustrating a bank 0 of semiconductor memory according to the exemplary embodiment.

FIG. 2 is a block diagram illustrating bank 0 of semiconductor memory. FIG. 2 corresponds to a diagram obtained by extracting the memory cell array areas 101 and read/write control circuits 102 of bank 0 of lower-order bits (DQ0 to DQ7) and bank 0 of higher-order bits (DQ8 to DQ15). A read/write bus RWBS, which includes bus wiring connected to the data input/output terminals (DQ0 to DQ7), and an LDM signal, which is a DQ0 to DQ7 data masking signal connected to the LDM terminal 105, are connected to the read/write control circuit 102 of the lower-order bits (DQ0 to DQ7). Similarly, a read/write bus RWBS connected to the data input/output terminals (DQ8 to DQ15), and a UDM signal, which is a DQ8 to DQ15 data masking signal, are connected to the read/write control circuit 102 of the higher-order bits (DQ8 to DQ15).

The read/write control circuits 102 are connected to the memory cell array areas 101 of the bits (DQ0 to DQ7, DQ8 to DQ15) via main data transmission lines (main I/O lines) MIO_T, MIO_B. The main data transmission lines MIO_T, MIO_B are bi-directional data transmission lines and are used in data transmission for writing write data and reading read data. These data transmission lines are data transmission lines for transmitting complementary signals comprising a non-inverted signal (True) and an inverted signal (Bar, namely the complement of the True signal).

The memory cell array area 101 has been divided into individual bits (DQ0 to DQ15). Disposed in the memory cell array area 101 of every bit, in addition to the memory cell array per se, are local data transmission lines (local I/O lines) LIO_T, LIO_B, selection switches (Y switches) and sense amplifiers, etc. The local data transmission lines LIO_T, LIO_B are data transmission lines connecting the main data transmission lines MIO_T, MIO_B and the memory cell array. The selection circuits are switches connecting the local data transmission lines LIO_T, LIO_B and the bit lines of the memory cell array. The sense amplifiers are connected to the bit lines of the memory cell array and amplify the bit-line potentials read out of the memory cells.

The read/write control circuit 102 is a circuit for controlling the read/write operation of the memory cell array. At the time of the write operation, write data that has been sent in serially via the read/write bus RWBS is converted to parallel data by the read/write control circuit 102 and is written to the memory cell array. For example, in the case of a DDR3 SDRAM, 8-bit pre-fetch is employed and therefore the write data that has been sent in serially from the read/write bus RWBS is rearranged into 8-bit parallel data and sent to the memory cell array in 8-bit parallel fashion via the data transmission lines. Specifically, for the single bit DQ0, there are eight sets of the main data transmission lines MIO_T, MIO_B, and data is written to the memory cell array in 8-bit parallel fashion (in the case where there is no data masking). Similarly, for each of bits DQ1 to DQ15, there are eight sets of the main I/O lines MIO_T, MIO_B. Therefore, for the total of 16 bits DQ0 to DQ15, 8 sets×16 DQ bits=128 sets of the main data transmission lines exist.

Figure 3:
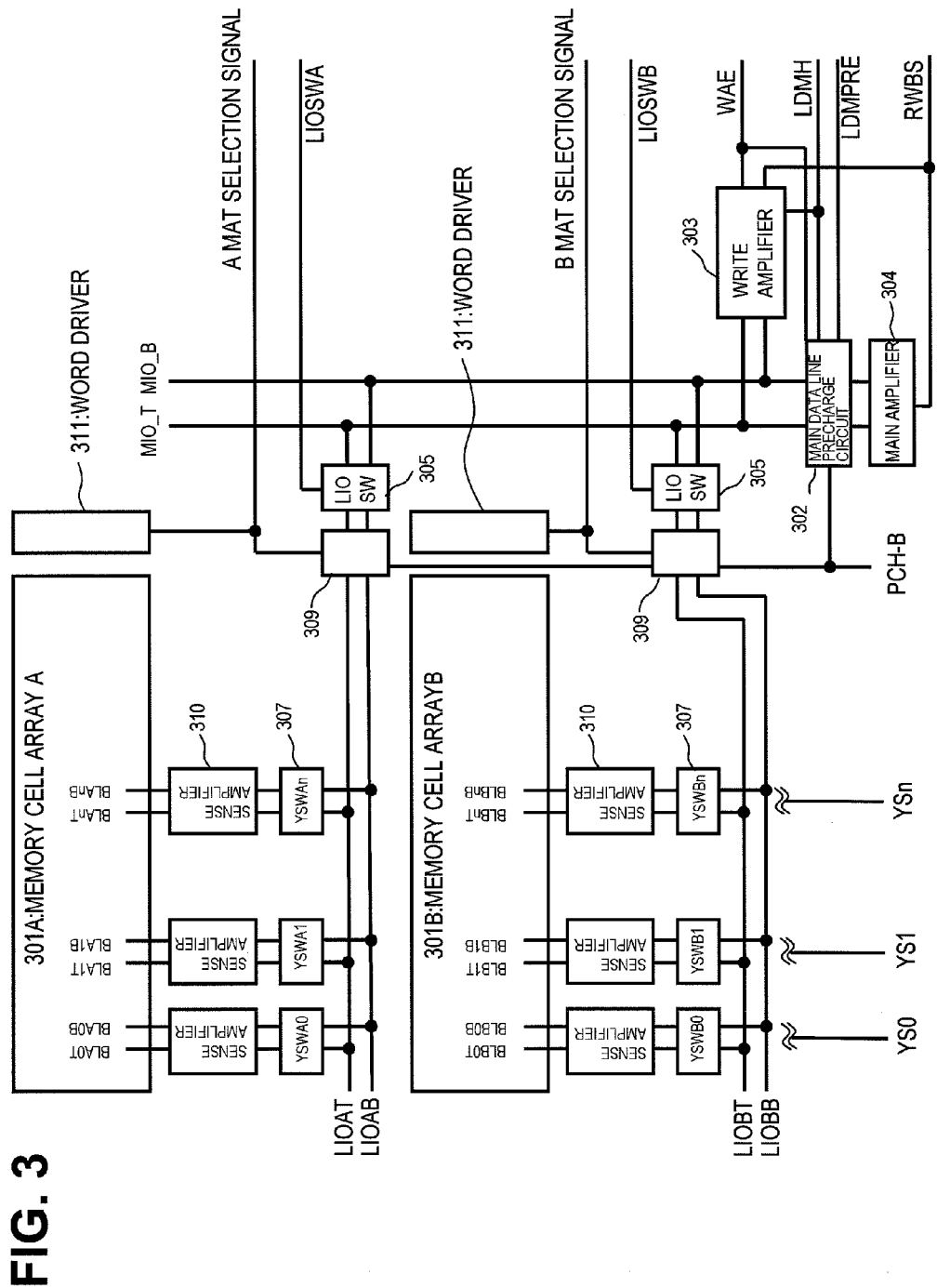
FIG. 3 is a block diagram illustrating DQ0 of bank 0 in the semiconductor memory according to the exemplary embodiment.

FIG. 3 is a block diagram illustrating a portion of DQ0 of bank 0 in the semiconductor memory 100. As mentioned above, there are eight sets MIO0 to MIO7 of the main data transmission lines MIO_T, MIO_B in DQ0 of bank 0. In FIG. 3, however, only one set of the main data transmission lines MIO_T, MIO_B is shown. Further, FIG. 3 includes the read/write control circuit 102 and the circuit of the memory cell array area 101 of the portion relating to DQ0 of bank 0 in FIG. 2. In FIG. 3, a main data line precharge circuit (data transmission line precharge circuit) 302, a write amplifier 303 and a main amplifier 304 correspond to the read/write control circuit 102 in FIG. 2, and the other blocks correspond to the memory cell array area 101.

In FIG. 3, the main data line precharge circuit (data transmission line precharge circuit) 302 precharges the main data transmission lines MIO_T, MIO_B. The main data transmission lines MIO_T, MIO_B transmit a pair of complementary signals comprising a non-inverted signal and an inverted signal. A precharge signal (inverted signal) PCH-B is connected to the main data line precharge circuit 302 as a signal for controlling precharging. A write-amplifier enable signal WAE, a DQ0 to DQ7 data mask holding signal LDMH and a data mask precharge signal LDMPRE are connected to the main data line precharge circuit 302 as signals for controlling precharge potential at the time of a second write mode, which is a mode for performing data masking. The DQ0 to DQ7 data mask holding signal LDMH, which is a signal of eight bits corresponding to respective ones of the above-mentioned 8-bit pre-fetched data, holds the data masking signal LDM, which has entered from the LDM terminal in synch with the serial pre-fetching of 8-bit data from the DQ terminals, until the end of the write command. In the case where data masking is performed, the data mask holding signal LDMH is asserted to the high level when data is written to the memory cell array and is de-asserted to the low level at the end of the write operation. The potential precharged by the main transmission data line precharge circuit 302 will be described in detail later.

When the write command has been received and the write-amplifier enable signal WAE asserted to the high level, the write amplifier 303 drives the main data transmission lines MIO_T, MIO_B based upon the logic level of the DQ0 signal that has entered from the read/write bus RWBS and outputs the write data toward memory cell arrays 301n (where only A and B are shown as n in FIG. 3).

When a read command is executed, the main amplifier 304 amplifies read data that has been sent from the memory cell arrays 301n through the local data transmission lines (local data line pair: local I/O lines) LIOnT, LIOnB (where only A and B are shown as n in FIG. 3) and main data transmission lines MIO_T, MIO_B, converts this data to serial data and outputs the serial data to the read/write bus RWBS.

The memory cell array A 301A and memory cell array B 301B are memory cell arrays in which DRAM cells have been disposed in matrix form in correspondence with the intersections between bit lines BLAnT, BLAnB, BLBnT, BLBnB and word lines (not shown). Since the internal configuration of the DRAM memory cell array is well known, no further description is given here. Although only the two memory cell arrays 301A and 301B are shown in FIG. 3, a larger number may be provided.

Provided in correspondence with the memory cell arrays 301A and 301B are word drivers 311 for driving designated word lines of designated memory cell arrays based upon the respective row addresses. An n mat selection signal (n is A and B in FIG. 3) is connected to each word driver. An n mat selection signal is a signal which, when a row address is designated by an ACT command, is activated based upon the designated address. When the memory cell array A 301A or memory cell array B 301B has been selected in FIG. 3, the corresponding A mat selection signal or B mat selection signal is activated. When the n mat selection signal is activated, the word driver 311 activates the designated word line based upon the designated row address.

Bit lines BLA0T, BLA0B, etc., of the memory cell arrays 301A, 301B are arranged as a bit-line pair for transmitting a pair of complementary signals comprising a non-inverted signal BLA0T, etc., and an inverted signal BLA0B, etc. The sense amplifiers 310 are connected to the respective bit-line pairs BLA0T, BLA0B, etc. The sense amplifiers 310 are used to amplify data that has been read out of the memory cells corresponding to the designated word lines. They are used for write-back when the DRAM cells are refreshed and when data from memory cells is read out externally in conformity with a read command.

Selection switches (Y switches: YSWAn, YSWBn) 307 are switches connecting bit lines BLA0T, BLA0B, etc., and local data transmission lines LIOnT, LIOnB (n is A and B in FIG. 3). The selection switches 307 are provided in correspondence with the bit-line pairs BLA0T, BLA0B, etc., of the memory cell arrays, and respective ones of selection switch selection signals YSn are connected to them. The selection switch selection signals YSn are asserted to the high level when selected by column addresses and connect selected bit-line pairs and the local data transmission line pairs LIOnT, LIOnB.

The local data transmission lines (local data line pair: local I/O lines) LIOnT, LIOnB (n is A and B in FIG. 3) are data transmission lines provided in correspondence with each memory cell array 301n. The local data transmission lines are connected to the main data transmission lines MIO_T, MIO_B via local data line selection switches 305. The main data transmission lines MIO_T, MIO_B connected via the local data line selection switches 305 to the local data transmission lines LIOnT, LIOnB provided in correspondence with each of the memory cell arrays 301n function overall as data transmission lines that transmit data between the write amplifier 303 and main amplifier 304 and each of the memory cell arrays 310n. The local data transmission lines LIOnT, LIOnB are also data transmission lines that transmit a pair of complementary signals comprising non-inverted signal LIOnT and the inverted signal LIOnB in a manner similar to that of the main data transmission lines MIO_T, MIO_B. Further, these are bi-directional data transmission lines for transmitting data, which has been read out of the memory cell arrays 301n, to the main data transmission lines MIO_T, MIO_B and for transmitting write data, which has been transmitted from the write amplifier 303 through the main data transmission lines MIO_T, MIO_B, to the memory cell arrays 301n.

The local data line selection switches (LIOSW) 305 are provided in correspondence with the local data transmission lines LIOnT, LIOnB and connect the corresponding local data transmission lines LIOnT, LIOnB with the main data transmission lines MIO_T, MIO_B. Connected to the local data line selection switches 305 are local data line selection switch control signals LIOSWn (n is A and B in FIG. 3). When the local data line selection switch control signal LIOSWn has been asserted to the high level, the corresponding local data transmission lines LIOnT, LIOnB and the main data transmission lines MIO_T, MIO_B are connected.

A local data transmission line precharge circuit 309 is provided for the local data transmission lines LIOnT, LIOnB. The n mat selection signal (n is A and B in FIG. 3) and the precharge signal PCH-B are connected to each local data transmission line precharge circuit 309. When the precharge command is executed, the precharge signal PCH-B is asserted to the low level and the local data transmission lines LIOnT, LIOnB are precharged to a voltage ½ VARY, which is intermediate the supply voltage (VARY) of the memory cell array 301n and a clamp level VSS=0V. Further, when the n mat selection signal connected to the local data transmission line precharge circuit 309 is asserted to the high level in response to receipt of an ACT command, the precharge potential of this local data transmission line pair LIOnT, LIOnB rises to the supply voltage (VPERI) of the peripheral circuit.

Figure 5:
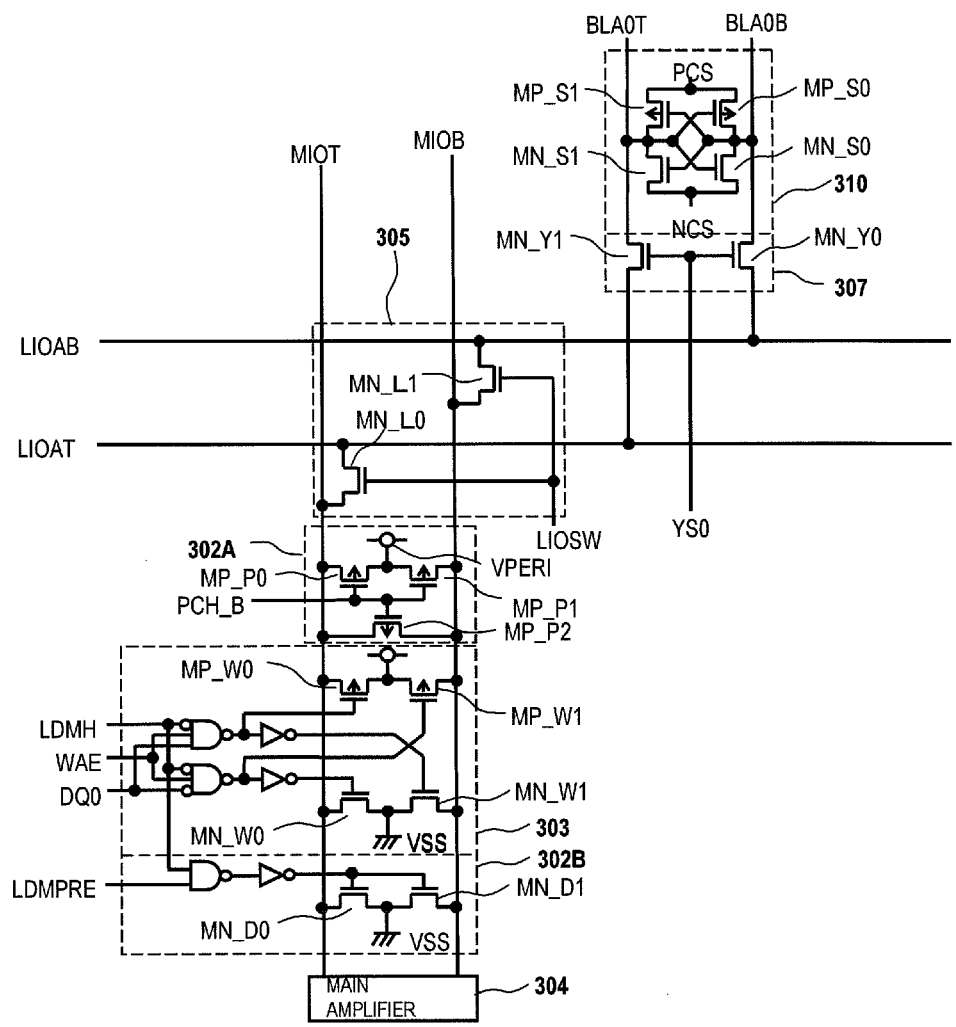
FIG. 5 is a circuit diagram of a read/write control circuit in the semiconductor memory according to the exemplary embodiment.

FIG. 5 is a circuit diagram showing the circuit arrangement within blocks of circuitry relating to the main data transmission lines MIO_T, MIO_B and local data transmission lines LIOAT, LIOAB from the write amplifier 303 to the bit lines BLA0T, BLA0B of the memory cell array A 301A. The circuit arrangement of FIG. 5 will now be described.

As shown in FIG. 5, the write amplifier 303 and data transmission line precharge circuits 302A, 302B are supplied with power from VPERI, which is the power supply of the peripheral circuit. On the other hand, the memory cell array and the sense amplifier 310 are supplied with power from VARY, the voltage of which is lower than that of VPERI of the peripheral circuit. In FIG. 5, a P-channel MOS transistor is represented by MP_XX, and an N-channel MOS transistor is represented by MN_XX.

The data transmission line precharge circuit in FIG. 5 includes the data transmission line precharge circuit 302A, which precharges the main data transmission line pair MIO_T, MIO_B to the VPERI potential when the precharge signal PCH-B is asserted to the low level by execution of the precharge command, and the data transmission line precharge circuit 302B, which changes the precharge potential to a potential lower than the VPERI potential in response to receipt of the write command for performing data masking.

When the corresponding data mask holding signal LDMH is de-asserted to the low level and the write-amplifier enable signal WAE is asserted to the high level, the write amplifier 303 sets one of the main data transmission lines MIO_T, MIO_B to the VPERI potential (high level) and the other to the VSS potential (low level) in accordance with the logic level of the DQ0 signal. It should be noted that the local data line selection switch 305 and selection switch 307 are both constituted by N-channel MOS transistors. Although the low level (VSS potential) driven by the write amplifier 303 can readily be transmitted up to the bit lines BLA0T, BLA0B, the high-level (VPERI) potential is not readily transmitted. The reason is that the potential difference across the gate and source becomes small when the transistor is turned ON. Accordingly, when data masking is not performed, it is preferred that the data transmission lines MIO_T, MIO_B, LIOAT, LIOAB be precharged to the high potential (VPERI potential).

When power is applied to PCS and NCS, the sense amplifier 310 is activated and amplifies the potential difference of the bit-line pair BLA0T, BLA0B. Owing to the precharge circuit of the bit lines (not shown), the bit-line pair BLA0T, BLA0B is precharged to the intermediate potential (½ VARY potential) of the same potentials by execution of the precharge command. Although the precharge circuit (309 in FIG. 3) of the local data transmission lines LIOAT, LIOAB is not shown in FIG. 5, the function thereof is as already described above in conjunction with FIG. 3.

Figure 4:
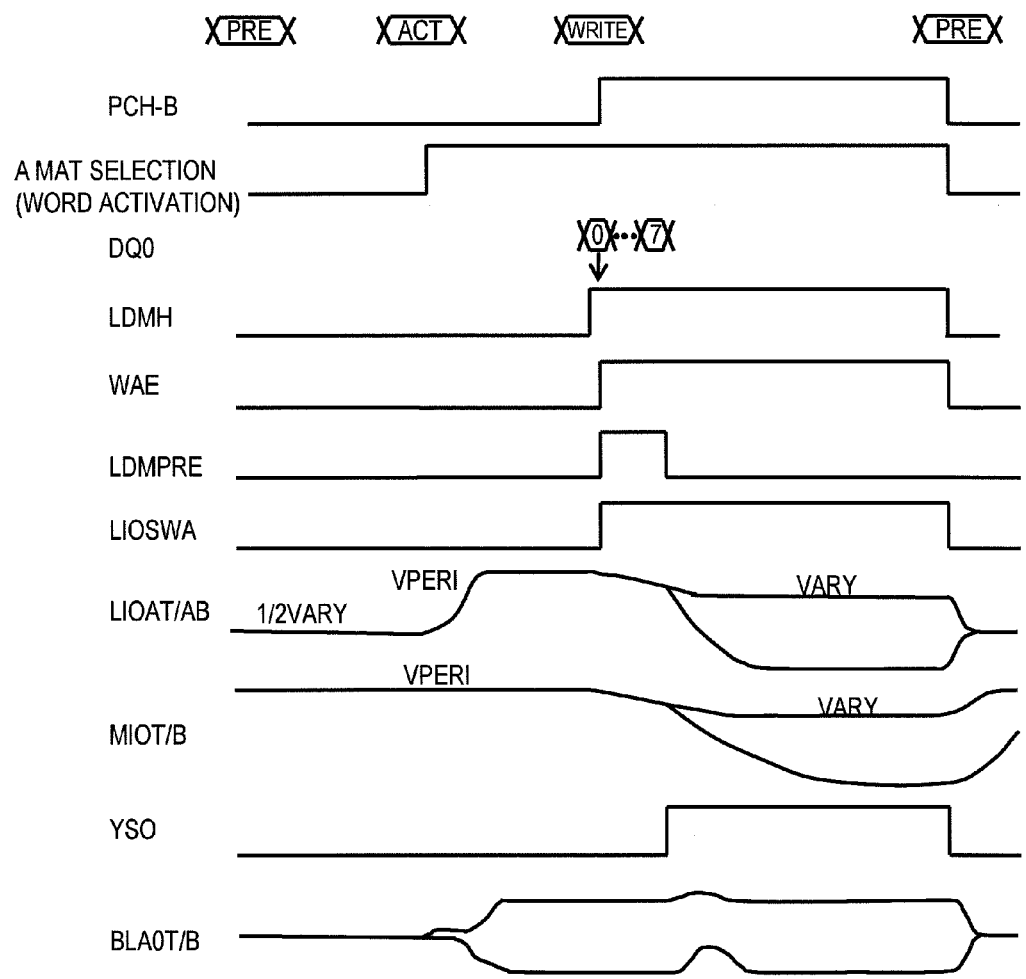
FIG. 4 is an operation waveform diagram in the case of a write mode in which data masking is performed in the semiconductor memory according to the exemplary embodiment.

FIG. 4 is an operation waveform diagram in the case of the write mode in which data masking is performed in the semiconductor memory 100. The operation of the semiconductor memory 100 will be described with reference to FIG. 4. By executing a precharge command PRE, the precharge signal PCH-B is asserted to the low level and the local data transmission lines LIOAT, LIOAB are precharged to the intermediate potential (½ VARY potential). Further, the main data transmission lines MIO_T, MIO_B are precharged to the high potential (VPERI potential). Furthermore, the n mat selection signal is de-asserted to the low level by execution of the precharge command PRE. The local data line selection switch control signal LIOSWA also is de-asserted to the low level, the local data line selection switch 305 is turned OFF and the main data transmission lines MIO_T, MIO_B are disconnected from the local data transmission lines LIOAT, LIOAB. Further, selection switch selection signal YS0 also is de-asserted to the low level and all of the selection switches 307 are turned OFF. The bit-line pair BLA0T, BLA0B is precharged to the intermediate potential (½ VARY potential) by execution of the precharge command PRE.

The reason for precharging the local data transmission lines LIOAT, LIOAB to the intermediate potential (½ VARY potential) is to so arrange it that a feed-through current will not flow between the bit-line pair BLA0T, BLA0B and the local data transmission lines LIOAT, LIOAB via the selection switches 307 owing to precharging to a potential identical with the precharge potential (½ VARY potential) of the bit lines.

Next, when the ACT command is executed, the A mat selection signal is asserted to the high level by designation of the row address. When this occurs, the word line of the selected memory cell array A 301A is activated in accordance with the designation of the row address and the data in the memory cell is read from the memory cell of the memory cell array A 301A to the sense amplifier via the bit lines BLA0T, BLA0B. When the memory-cell data is read out to the sense amplifier, the sense amplifier 310 is activated and the potential difference between the bit lines BLA0T, BLA0B is amplified. It should be noted that the memory cell array B for which there is no row-address designation is held in the precharged state. The potential of the bit-line pair also remains at the intermediate potential (½ VARY potential) of the same potentials.

Further, the precharge potential of the local data transmission lines LIOAT, LIOAB of the A mat is changed to the high potential (VPERI potential). The precharge potential of the local data transmission lines LIOBT, LIOBB of the B mat remains the intermediate potential (½ VARY potential). The reason for raising the precharge potential of the local data transmission lines LIOAT, LIOAB of the A mat, selected by execution of the ACT command, to VPERI is that the core of the arrangement is NMOS, according to which the main amplifier 304 that receives the read data and the sense amplifier 310 that receives the write data both exhibit little process variations and have a small area. Further, since the selection switch 307 and local data line selection switch 305 are constituted by N-channel MOS transistors, the high level is not readily transmitted. Accordingly, regardless of whether read or write is considered, it is preferred that, in a case where data is read and written, the precharge potential of the main data transmission lines MIO_T, MIO_B and local data transmission lines LIOAT, LIOAB be a high level, or more specifically, VPERI, which is the supply voltage level of the peripheral circuit.

On the other hand, the precharge potential of the local data transmission lines LIOBT, LIOBB of mat B, which has not been selected, holds the intermediate potential (½ VARY potential). This is to prevent the flow of a feed-through current between the bit-line pair BLA0T, BLA0B and the local data transmission lines LIOAT, LIOAB via the selection switch 307 when the selection switch selection signal YSn is asserted and attains the high level.

Next, when a write command WRITE is executed, the precharge signal PCH-B is de-asserted and attains the high level. Accordingly, precharging of the main data transmission lines MIO_T, MIO_B to the VPERI potential is removed. Further, the DQ0 to DQ7 data mask holding signal LDMH is asserted to the high level. Furthermore, the write-amplifier enable signal WAE is asserted to the high level and the data mask precharge signal LDMPRE is asserted to the high level for a fixed period of time. When this occurs, the N-channel MOS transistors MN_D0 and MN_D1 of the data transmission line precharge circuit of FIG. 5 conduct only during the time that the signal LDMPRE is at the high level, and the potential of the main data transmission lines MIO_T, MIO_B that have been charged to VPERI falls only by a fixed voltage. It should be noted that the potential drop of the voltage due to conduction of the N-channel MOS transistors MN_D0 and MN_D1 can be adjusted by the channel size of the N-channel MOS transistors MN_D0 and MN_D1 and time over which the LDMPRE signal is asserted to the high level. It should be noted that the LDMPRE signal is de-asserted to the low level at least by the time the selection switch selection signal YS0 is asserted to the high level.

Owing to execution of the write command WRITE, the local data transmission line selection switch control signal LIOSWA is asserted to the high level and the local data line selection switch 305 connecting the main data transmission lines MIO_T, MIO_B and local data transmission lines LIOAT, LIOAB conducts. Accordingly, with the drop in the potential of the main data transmission lines MIO_T, MIO_B, the potential of the local data transmission lines LIOAT, LIOAB also drops.

Next, the selection switch selection signal YS0 is asserted to the high level. When this occurs, the corresponding selection switch 307 (YSWA0 in FIG. 3) conducts and the voltage of the bit lines BLA0T, BLA0B amplified by the sense amplifier 310 is output to the local data transmission lines LIOAT, LIOAB. Further, since the local data line selection switch 305 is conducting, a change in the potential of the local data transmission lines LIOAT, LIOAB is accompanied by a change also in the potential of the main data transmission lines MIO_T, MIO_B.

It should be noted that when the selection switch 307 conducts, the precharging operation is completed and therefore the precharge transistors connected to the main data transmission lines MIO_T, MIO_B and local data transmission lines LIOAT, LIOAB are not conducting. However, when the selection switch 307 conducts, the potential of the bit lines BLA0T, BLA0B is influenced by the potential of the electric charge being held in the main data transmission lines MIO_T, MIO_B and local data transmission lines LIOAT, LIOAB. In particular, in the prior art, the precharge potential of the main data transmission lines MIO_T, MIO_B and local data transmission lines LIOAT, LIOAB remains at VPERI. The potential VPERI of the power supply level of the peripheral circuit is a potential higher than the high-level potential VARY (the supply voltage level of the cell array) at which the sense amplifier 310 holds data. Accordingly, in a case where the transistors that construct the sense amplifier 310 are unbalanced, there is the danger that the data held by the sense amplifier 310 will be inverted by the potential of the data transmission lines.

In this exemplary embodiment, on the other hand, the precharge potential of the main data transmission lines MIO_T, MIO_B and local data transmission lines LIOAT, LIOAB is lowered by the data mask precharge signal LDMPRE. This means that the logic level of the sense amplifier will not be inverted even if the potential of the bit lines BLA0T, BLA0B is influenced somewhat by conduction of the selection switch 307.

Next, when the write operation ends, the data mask holding signal LDMH also is de-asserted to the low level and so is the write-amplifier enable signal WAE. When the precharge command PRE is executed again, the precharge signal PCH-B is asserted to the low level and the A mat selection signal is de-asserted to the low level. Furthermore, the local data line selection signal LIOSWA is de-asserted to the low level and the local data line selection switch is turned OFF, thereby disconnecting the main data transmission lines MIO_T, MIO_B and the local data transmission lines LIOAT, LIOAB. The selection switch selection signal YS0 also is de-asserted to the low level, the main data transmission lines MIO_T, MIO_B are precharged to the VPERI potential and the local data transmission lines LIOAT, LIOAB and bit lines BLA0T, BLA0B are precharged to ½ VARY to restore the initial state.

Operation at execution of the read command will be described next. In a case where the read command is executed, the selection switch 307 conducts first and then the local data line selection switch 305 conducts thereafter. Accordingly, data masking is carried out and, as at the time of execution of the write command, the electric charge on the main data transmission lines MIO_T, MIO_B and local data transmission lines does not flow into the bit lines BLA0T, BLA0B at one stroke owing to conduction of the selection switch 307. When the sensing operation of the main amplifier 304 is considered, the precharge potential of the data transmission lines is a potential for which VPERI is suitable.

FIG. 7 is an operation waveform diagram at the time of execution of the write command in a case where bits that are data-masked and bits that are not data-masked are mixed with regard to serially prefetched data of four bits. By changing the level of the LDM terminal (and similarly also for the UDM terminal and DM terminal) for every bit of the data input serially from the DQ terminal, it is possible to select, bit by bit, whether or not data masking is performed. In FIG. 7, out of four bits of serially input data, two bits MIO0, MIO2 undergo data masking and two bits MIO1, MIO3 are written without undergoing data masking. As described above with reference to FIG. 3, eight sets of the main data transmission lines MIO_T, MIO_B exist per DQ terminal (one bit), and data of four serially input bits is written in parallel using four sets of main data transmission lines of MIO0 to MIO3. During the period of execution of the write command, the data mask holding signal LDMH corresponding to MIO0, MIO2 is maintained at the high level. On the other hand, the data mask holding signal LDMH corresponding to MIO1, MIO3 remains at the low level.

As shown in FIG. 7, the main data transmission lines MIO are all precharged to the VPERI potential before execution of the write command WRITE. On the main data transmission lines of MIO0, MIO2 for performing data masking by start of execution of the write command WRITE, the precharge potential VPERI is lowered by activation of the LDMPRE signal. On the other hand, with regard to MIO1, MIO3 that do not perform data masking, the output buffer of the write amplifier 303 conducts and data that has entered from the DQ terminals is output as complementary signals to the main data transmission lines MIO and is driven to VPERI and VSS. When the selection switch selection signal YS attains the high level and is activated, the selection switch 307 opens and the main data transmission line MIO and bit line BL are connected via the local data transmission line LIO. On the MIO0, MIO2 that have undergone data masking, the potential of the bit line BL is output also to the main data transmission line MIO. With regard to the bits that do not undergo data masking, however, the data of the sense amplifier 310 is rewritten by the output data of the write amplifier 303 and the output data of the write amplifier 303 remains as the potential of the main data transmission line MIO.

Thereafter, the potential of the main data transmission line MIO is precharged to the potential of the power supply level VPERI of the peripheral circuitry irrespective of whether data masking has been performed by execution of the precharge command PRE.

Figure 6A:
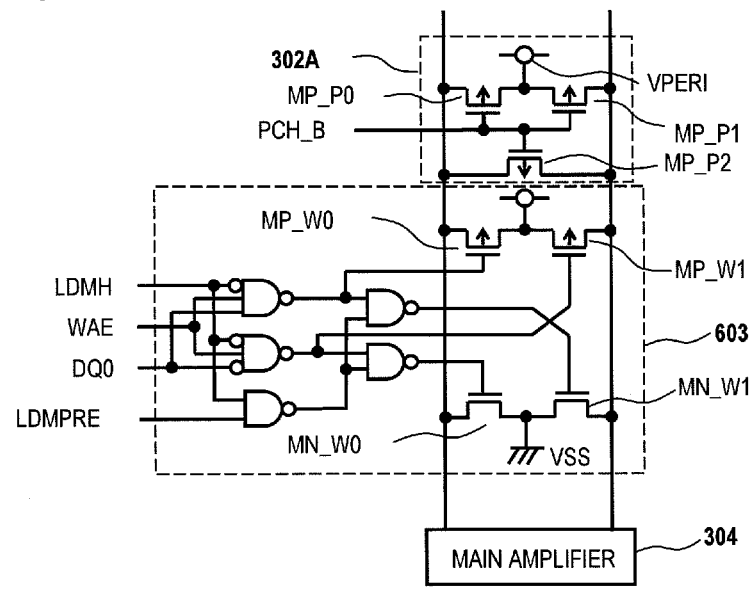
FIG. 6A is a circuit diagram illustrating a modification and FIG. 6B a circuit diagram illustrating another modification of a data transmission line precharge circuit and write amplifier circuit in the semiconductor memory according to the exemplary embodiment.

Described next are modifications of the data transmission line precharge circuit of the first exemplary embodiment, particularly the precharge circuit at the time of the write mode for performing data masking corresponding to 302B in FIG. 5. FIG. 6A is an exemplary embodiment in which the precharge circuit at the time of the write mode for performing data masking is used also as a discharging N-channel MOS transistor of a write amplifier 603. The area of the precharge circuit can be reduced because it is not necessary to newly provide an N-channel MOS transistor for precharge level adjustment at the time of the write mode in which data masking is performed. It should be noted that blocks (circuits enclosed by the dashed-line rectangles) that are no different from those of the circuit of FIG. 5 are designated by the same reference characters as those used in FIG. 5 and are not described again.

Figure 6B:
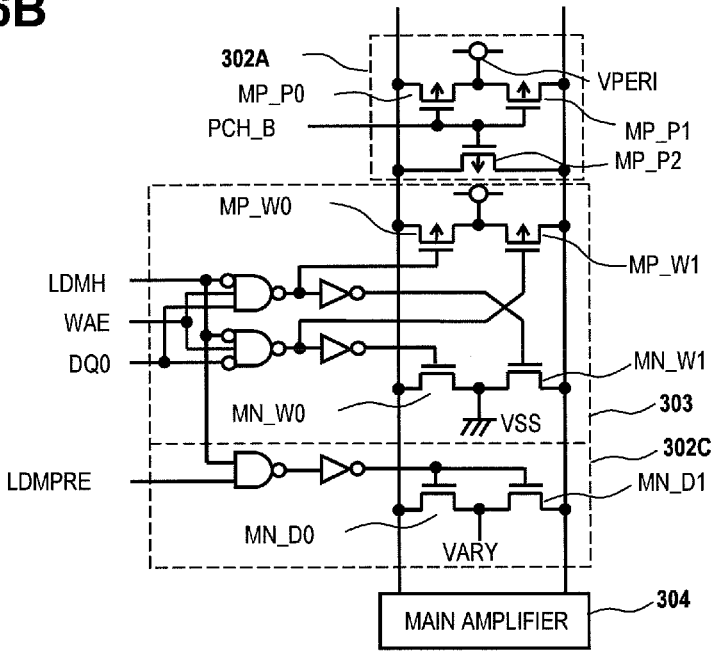

FIG. 6B is a data transmission line precharge circuit 302C in which the power supply of the source of the N-channel MOS transistor in the precharge circuit 302B at the time of the write operation in which data masking is performed in FIG. 5 is changed from VSS to the power supply VARY of the memory cell array. This circuit is identical with the circuit of FIG. 5 in other respects. Since the potential of VARY is close to the potential of VPERI, the potential level of the main data transmission lines MIO_T, MIO_B can be changed more gently than when VSS is used.

Figure 8:
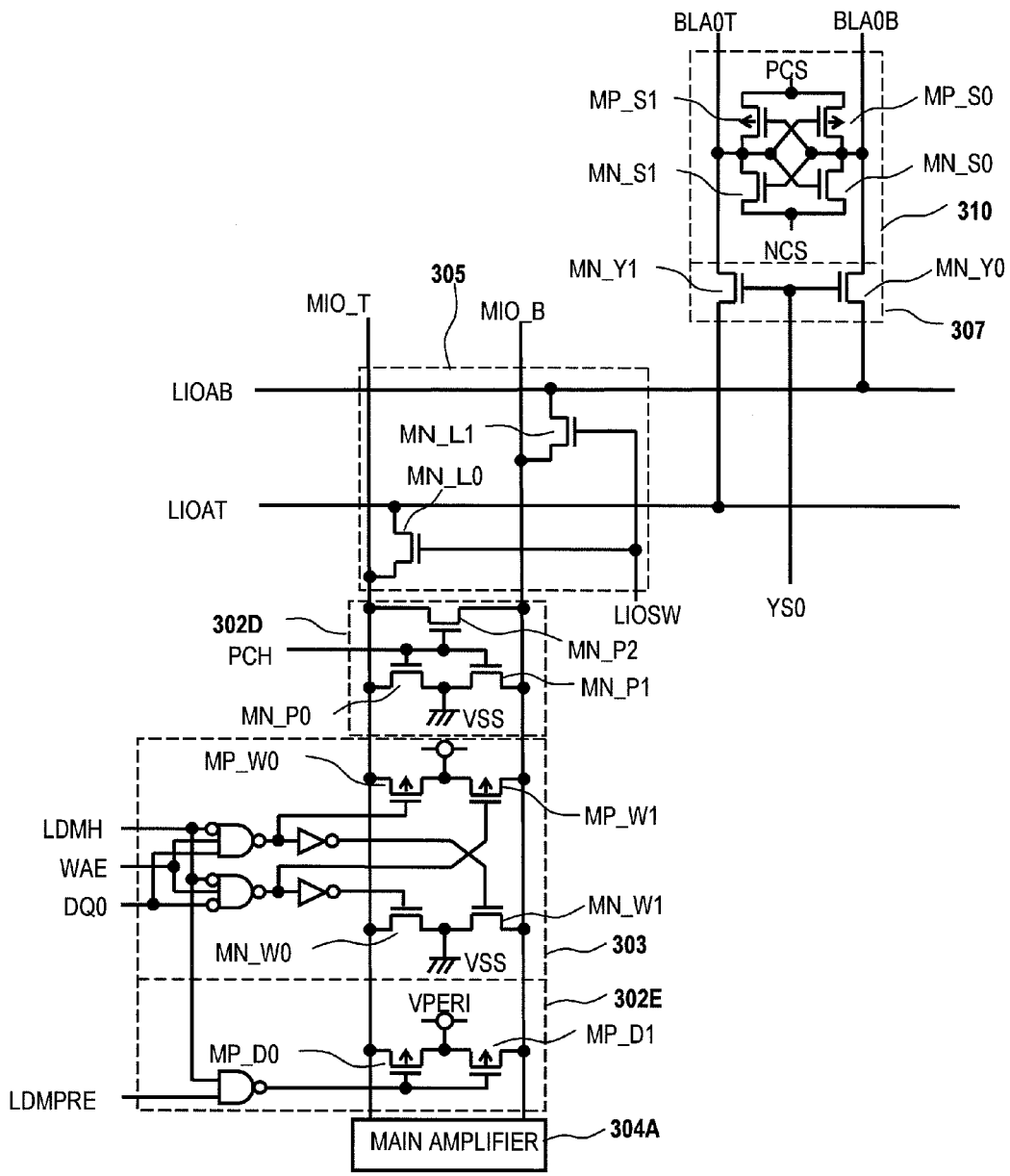
FIG. 8 is a circuit diagram illustrating another modification of a data transmission line precharge circuit in the semiconductor memory according to the exemplary embodiment.

FIG. 8 is an example of data transmission line precharge circuits 302D, 302E in a case where the precharge potential of the main data transmission lines MIO_T, MIO_B is made VSS and not VPERI. At the time of the write mode in which, at execution of the precharge command, precharging is performed to the VSS potential and data masking is performed, the precharge potential is raised by the data transmission line precharge circuit 302E. Further, a main amplifier 304A also is changed in a case where a change is necessary owing to a change in precharge potential. Furthermore, in FIG. 8, the selection switch 307 and local data line selection switch 305 remain constituted by N-channel MOS transistors. However, the selection switch and local data line selection switch may just as well be constituted by P-channel MOS transistors.

It should be noted that exemplary embodiments have been described in which a data transmission line precharge circuit corresponding to the second write mode for performing data masking is mainly provided for the main data transmission lines MIO_T, MIO_B. However, the data transmission line precharge circuit may also be provided for the local data transmission lines LIOn_T, LIOn_B. However, in order to reduce the number of elements of the data transmission line precharge circuit overall, a data transmission line precharge circuit corresponding to the write mode for performing data masking preferably is provided for the main data transmission lines MIO_T, MIO_B.

Although exemplary embodiments relating to a DRAM have been described above, the present invention is not limited to a DRAM. For example, the invention is applicable generally to a semiconductor memory having a write mode in which data masking is performed and a write mode in which data masking is not performed. Furthermore, the invention is not limited to a semiconductor memory. In a semiconductor device having a function for writing data via a data transmission line and a function for performing data masking, precharging to a potential ideal for data write can be performed when data masking is not carried out, and the precharge potential can be made a potential of little influence on the side that receives data. In accordance with the present invention, operation on the side that receives data need not be changed depending upon whether or not data masking is performed. In particular, in the write mode in which data masking is not performed, precharged can be performed to the high level or low level. In the write mode in which data masking is performed, precharged can be performed to a potential that is intermediate the high and low levels.

By way of example, if the sense amplifier 310 in FIG. 5 is considered to be an SRAM cell or a flip-flop of a register, the invention is applicable to a precharge circuit of data transmission lines to a write mode in which data is written to the SRAM cell or register without performing data masking and a write mode in which data masking is performed.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A semiconductor device, comprising:
a data transmission line;
a data transmission line precharge circuit that sets a precharge potential of the data transmission line to a first potential at a time of a first write ode in which data masking is not performed, and to a potential different from the first potential at a time of a second write mode in which data masking is performed;

a write amplifier that discharges the data transmission line, which has been precharged at the time of the first write mode, to a second potential;

a memory cell array; and a plurality of selection switches, which are placed between the data transmission line and the memory cell array, that connects the data transmission line to a corresponding bit line of said memory cell array when turned ON;

wherein at the time of the second write mode, said data transmission line precharge circuit sets the precharge potential of the data transmission line to an intermediate potential that is intermediate the first and the second potential.

2. The semiconductor device according to claim 1, wherein said data transmission line precharge circuit sets the precharge potention of the data transmission line to the first potential beforehand irrespective of which of the write modes is in effect, and change the precharge potential to the intermediate potential at the time of the second write mode.

3. The semiconductor device according to claim 1, wherein the data transmission line comprises a data transmission line pair that transmits complementary signals including a non-inverted signal and an inverted signal, and one data transmission line of the data transmission line pair precharged to the first potential is discharged to the second potential at the time of the first write mode.

4. The semiconductor device according to claim 2, wherein said data transmission line precharge circuit includes:
a transistor of a first conductivity type that precharges the data transmission line to the first potential; and
a transistor of a second conductivity type that changes the precharged potential to the intermediate potential.

5. The semiconductor device according to claim 2, wherein said data transmission line precharge circuit turns on a transistor to which a power supply is connected as the second potential for a short period of time, thereby changing the precharge potential to the intermediate potential.

6. The semiconductor device according to claim 4, wherein the transistor of the second conductivity type of said data transmission line precharge circuit is used also as a discharge transistor of said write amplifier, and said data transmission line precharge circuit turns on the transistor of the second conductivity type for a shorter time period at the time of changing the precharge potential in the second write mode than a time period of discharging to the second potential in the first write mode.

7. The semiconductor device according to claim 1, wherein said data transmission line precharge circuit includes a precharge potential adjusting transistor supplied with power from an intermediate potential that is intermediate the first and a second potential and exercises control such that the precharge potential of the data transmission line is made the potential different from the first potential by turning on said precharge potential adjusting transistor, and wherein the second potential is a discharged potential in the first write mode.

8. A semiconductor device comprising:
a memory cell array including a plurality of bit lines;
a plurality of selection switches each connected to a corresponding one of said plurality of bit lines;
a plurality of write amplifiers;
a plurality of data transmission line pairs, each of which connects a corresponding one of said write amplifiers and corresponding ones of said plurality of selection switches, each of the plurality of data transmission line pairs transmitting output data of said corresponding write amplifier as a pair of complementary signals, which comprise a non-inverted signal and an inverted signal, at write time; and
a data transmission line precharge circuit that precharges said plurality of data transmission line pairs to a first potential and subsequently sets, to an intermediate potential, a precharge potential of a data transmission line pair that performs data masking among said plurality of data transmission line pairs at write time;
wherein the intermediate potential is a potential that is intermediate the first potential and a second potential at which said write amplifier discharges one data transmission line of a data transmission line pair that does not perform data masking at write time.

9. The semiconductor device according to claim 8, wherein at write time said data transmission line precharge circuit sets the precharge potential of a data transmission line pair that performs data masking, from among said plurality of data transmission line pairs, from the first potential to the intermediate potential;
after which a write amplifier, from among said plurality of write amplifiers, which corresponds to a data transmission line pair other than said data transmission line pair that performs data masking, discharges one data transmission line of the corresponding data transmission line pair to the second potential; and
a plurality of selection switches, from among said plurality of selection switches, which are selected by an address are turned ON, and data that is output from the write amplifier connected to the data transmission line pair other than said data transmission line pair that performs data masking, from among said plurality of data transmission line pairs, is written to the memory cell array in parallel.

10. The semiconductor device according to claim 8, wherein each data transmission line pair includes:
a main data line pair connected to a corresponding write amplifier;
a plurality of local data line pairs each connected to ones of said plurality of selection switches; and
a plurality of local data line selection switches respectively connecting said main data line pair and said plurality of local data line pairs;
at write time, and in conformity with a write address, a local data line selection switch of a corresponding address is turned ON among said plurality of local data line selection switches, after which the selection switches of the corresponding address and output of a write amplifier that does not perform data masking are turned ON; and
said data transmission line precharge circuit sets the precharge potential of the data transmission line pair that performs data masking to the intermediate potential before said selection switches are turned ON.

11. The semiconductor device according to claim 10, wherein said data transmission line precharge circuit sets the precharge potential of said main data line pair to the intermediate potential.

12. The semiconductor device according to claim 10, wherein said data transmission line precharge circuit sets the precharge potential of said local data line pair to the intermediate potential.

13. The semiconductor device according to claim 10, further comprising a plurality of sense amplifiers connected to said plurality of bit lines;
wherein the first potential is applied as supply voltage to a peripheral circuit that includes said write amplifier; and a third potential closer to the second potential than the first potential is applied as supply voltage to said memory cell array and to said plurality of sense amplifiers, and the intermediate potential is the third potential or a potential intermediate the first potential and the third potential.

14. The semiconductor device according to claim 9, further comprising a plurality of main amplifier, each of which is connected to one of said plurality of data transmission line pairs and, when read is executed, read data is transmitted from said memory cell array to one of the plurality of main amplifiers via one of said plurality of selection switches and corresponding one of said plurality of data transmission line pairs.

15. The semiconductor device according to claim 8, further comprising a data input/output terminal, a data mask terminal and a command input terminal;
wherein in response to a write command that has been input from said command input terminal, data is written to said memory cell array in parallel via said plurality of data transmission line pairs based upon a write data signal and a data mask signal that have been input serially from said data input/output terminal and said data mask terminal, respectively, in synch with a clock.

16. A semiconductor device comprising:
first and second bit lines;
a sense amplifier electrically coupled to the first and second bit lines to amplify a potential difference between the first and second bit lines;
first and second data transmission lines operatively coupled to the first and second bit lines, respectively;
a data transmission line precharge circuit coupled to the first and second data transmisson lines, and being configured to precharge each of the first and second data transmission lines to a first potential when a data masking signal takes a first logic level and a second potential when the data masking signal takes a second logic level; and
a write amplifier coupled to the first and second data transmission lines, and being configured to drive one of the first and second data transmission lines to the first potential and drive the other of the first and second data transmission lines to a third potential when the data masking signal takes the first logic level;
the first potential being greater than the third potential, the second potential being an intermediate potential between the first and third potentials.

17. The semiconductor device according to claim 16, wherein the write ampilfier is configured not to drive each of the first and second data transmission lines when the data masking signal takes the second logic level.

18. The semiconductor device according to claim 16, wherein the data transmission line precharge circuit that includes:
first and second voltage terminals supplied with the first and second voltages, respectively;
a first transistor coupled between the first data transmission line and the first voltage terminal;
a second transistor coupled between the second data transmission line and the first voltage terminal, a gate of the second transistor being coupled to a gate of the first transistor;
a third transistor coupled between the first data transmission line and the second voltage terminal; and
a fourth transistor coupled between the second data transmission line and the second voltage terminal, a gate of the fourth transistor being coupled to a gate of the third transistor;
each of the first and second transistors comprising a first conductivity type transistor and each of the third and fourth transistors comprising a second conductivity type transistor.

19. The semiconductor device according to claim 18, wherein the data transmission line precharge circuit further includes a fifth transistor coupled between the first and second data transmission lines, the fifth transistor comprising a P-type transistor, a gate of the fifth transistor being coupled in common to gates of the first and second transistors.

20. The semiconductor device according to claim 16, further comprising:
first and second local data transmission lines;
a first selection switch coupled between the first local data transmission line and the first data transmission line;
a second selection switch coupled between the second local data transmission line and the second data transmission line;
a third selection switch coupled between the first local data transmission line and the first bit line; and
a fourth selection switch coupled between the second local data transmission line and the second bit line;
the first bit line and the first data transmission line being electrically coupled when both the first and third selection switches turn on, the second bit line and the second data transmission line being electrically coupled when both the second and fourth selection switches turn on.

21. The semiconductor device according to claim 20, wherein each of the third and fourth transistors comprises a second conductivity type transistor.

22. The semiconductor device according to claim 21, wherein each of the first and second transistors comprises the second conductivity type transistor.

23. The semiconductor device according to claim 16, wherein the data transmission line precharge circuit is configured to set the first potential to each of the first and second data transmission lines and subsequently precharge each of the first and second data transmission lines to the second potential when the data masking signal takes the second logic level.

* * * * *